(12) United States Patent
Moon et al.

(10) Patent No.: US 11,974,405 B2
(45) Date of Patent: Apr. 30, 2024

(54) ELECTRONIC DEVICE HOUSING AND ELECTRONIC DEVICE INCLUDING THE SAME

(71) Applicant: SAMSUNG ELECTRONICS CO., LTD., Suwon-si (KR)

(72) Inventors: Youngmin Moon, Suwon-si (KR); Jaehyun Bae, Suwon-si (KR); Hyunsuk Choi, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/889,898

(22) Filed: Aug. 17, 2022

(65) Prior Publication Data
US 2023/0065427 A1 Mar. 2, 2023

Related U.S. Application Data

(63) Continuation of application No. PCT/KR2022/009746, filed on Jul. 6, 2022.

(30) Foreign Application Priority Data

Aug. 30, 2021 (KR) .................. 10-2021-0114685

(51) Int. Cl.
*H05K 5/02* (2006.01)
*B32B 1/00* (2006.01)
(Continued)

(52) U.S. Cl.
CPC .............. *H05K 5/02* (2013.01); *B32B 1/00* (2013.01); *B32B 3/266* (2013.01); *B32B 3/30* (2013.01);
(Continued)

(58) Field of Classification Search
CPC .......... H05K 5/02; H05K 5/00; H05K 5/0017; H05K 5/0086; C03C 27/04; C03C 27/048; C03C 27/042; C04B 2235/9607; C04B 2237/083; C04B 2237/10; C04B 2237/16; C04B 2237/32; C04B 2237/59; C04B 37/045; G06F 1/1656; H04M 1/0202;
(Continued)

(56) References Cited

U.S. PATENT DOCUMENTS

2020/0205288 A1* 6/2020 Takazane ............... H05K 1/189

FOREIGN PATENT DOCUMENTS

CN 110968151 * 4/2020
JP 2006297929 A 11/2006
(Continued)

OTHER PUBLICATIONS

PCT Search Report for PCT/KR2022/009746 dated Oct. 13, 2022.

*Primary Examiner* — James C Yager
(74) *Attorney, Agent, or Firm* — CANTOR COLBURN LLP

(57) ABSTRACT

An electronic device housing, and an electronic device including the same are provided. The electronic device housing includes a substrate including glass, an insert portion which is bonded to the substrate at a surface of the insert portion, and at which a functional component of an electronic device having the electronic device housing is disposed, and an elastic layer which is between the substrate and the insert portion and extends along the surface of the insert portion.

14 Claims, 11 Drawing Sheets

(51) Int. Cl.
  *B32B 3/26* (2006.01)
  *B32B 3/30* (2006.01)
  *B32B 5/02* (2006.01)
  *B32B 7/022* (2019.01)
  *B32B 7/12* (2006.01)
  *B32B 9/00* (2006.01)
  *B32B 9/04* (2006.01)
  *B32B 15/08* (2006.01)
  *B32B 15/14* (2006.01)
  *B32B 17/06* (2006.01)
  *B32B 17/10* (2006.01)
  *B32B 27/28* (2006.01)
  *B32B 37/06* (2006.01)
  *B32B 37/10* (2006.01)
  *B32B 38/00* (2006.01)

(52) U.S. Cl.
  CPC ............... *B32B 5/02* (2013.01); *B32B 7/022* (2019.01); *B32B 7/12* (2013.01); *B32B 9/005* (2013.01); *B32B 9/045* (2013.01); *B32B 9/047* (2013.01); *B32B 15/08* (2013.01); *B32B 15/14* (2013.01); *B32B 17/067* (2013.01); *B32B 17/10* (2013.01); *B32B 27/283* (2013.01); *B32B 37/06* (2013.01); *B32B 37/10* (2013.01); *B32B 38/0036* (2013.01); *B32B 2038/0048* (2013.01); *B32B 2250/03* (2013.01); *B32B 2255/02* (2013.01); *B32B 2255/10* (2013.01); *B32B 2255/20* (2013.01); *B32B 2262/105* (2013.01); *B32B 2307/306* (2013.01); *B32B 2307/51* (2013.01); *B32B 2307/538* (2013.01); *B32B 2307/54* (2013.01); *B32B 2307/734* (2013.01); *B32B 2315/08* (2013.01); *B32B 2457/00* (2013.01)

(58) Field of Classification Search
  CPC ........... C03B 23/03; B32B 1/00; B32B 3/266; B32B 3/30; B32B 5/02; B32B 7/022; B32B 7/12; B32B 9/005; B32B 9/045; B32B 9/047; B32B 15/08; B32B 15/14; B32B 17/067; B32B 17/10; B32B 27/283; B32B 37/06; B32B 37/10; B32B 38/0036; B32B 2038/0048; B32B 2250/03; B32B 2255/02; B32B 2255/10; B32B 2255/20; B32B 2262/105; B32B 2307/306; B32B 2307/51; B32B 2307/538; B32B 2307/54; B32B 2307/734; B32B 2315/08
  See application file for complete search history.

(56) References Cited

FOREIGN PATENT DOCUMENTS

| | | | |
|---|---|---|---|
| JP | 2011079221 | A | 4/2011 |
| JP | 5382276 | B1 | 1/2014 |
| JP | 5788836 | B2 | 10/2015 |
| JP | 2016018092 | A | 2/2016 |
| JP | 2017022265 | A | 1/2017 |
| JP | 6530662 | B2 | 6/2019 |
| KR | 101165892 | B1 | 7/2012 |
| KR | 101502182 | B1 | 3/2015 |
| KR | 101596843 | B1 | 2/2016 |
| KR | 20210015268 | A | 2/2021 |

\* cited by examiner

ELECTRONIC DEVICE HOUSING AND ELECTRONIC DEVICE INCLUDING THE SAME

CROSS-REFERENCE TO RELATED APPLICATIONS

This application is a continuation application of International Application No. PCT/KR2022/009746 designating the United States, filed on Jul. 6, 2022, in the Korean Intellectual Property Receiving Office and claiming priority to Korean Patent Application No. 10-2021-0114685, filed on Aug. 30, 2021, in the Korean Intellectual Property Office, the disclosures of which are incorporated by reference herein in their entireties.

BACKGROUND

1. Field

The disclosure relates to an electronic device housing and an electronic device including the same.

2. Description of Related Art

An electronic device refers to a device that performs a specific function according to an executable program, such as a home appliance, an electronic note, a portable multimedia player, a mobile communication terminal, a tablet personal computer (PC), a video/audio device, a desktop/laptop computer, a vehicle navigation system, and the like. For example, such electronic devices may output stored information as sound or images. Along with an increase in the integration level of electronic devices and the increasing popularity of ultra-high-speed, large-capacity wireless communication, various functions have been loaded in a single electronic device, such as a mobile communication terminal. For example, an entertainment function such as gaming, a multimedia function such as music/video play, a communication and security function for mobile banking, a scheduling function, and an electronic wallet function as well as a communication function have been integrated in a single electronic device.

An electronic device includes a support member and a housing formed of various materials. The housing and the support member of the electronic device are configured to protect internal components such as functional components of the electronic device, from an external impact. In addition, the housing and the support member may be manufactured or provided such that transport of the electronic device is relatively easy and an aesthetic appearance of the electronic device is improved during use of such device.

SUMMARY

The housing of an electronic device may be manufactured (or provided) using various materials such as metal, glasses and/or ceramic. However, housing elements of different materials which are bonded to each other, may be easily separated from each other. For example, a bonding portion may have a complex shape to increase the fastening force, which may lead to an increase in a difficulty of a manufacturing process and in the unit cost of manufacturing.

Various example embodiments provide an electronic device housing that includes a substrate including glass, and an insert portion corresponding to a functional component of the electronic device and including a material different from that of the substrate.

Various example embodiments provide an electronic device housing that includes an elastic layer disposed between a substrate and an insert portion, and that has an enhanced coupling force by effectively dispersing stress caused by contraction and expansion of the substrate and the insert portion.

An electronic device housing according to various example embodiments may include a substrate including glass, an insert portion, and an elastic layer disposed between the substrate and the insert portion.

According to various example embodiments, the elastic layer may be formed to cover at least a portion of the insert portion.

An electronic device according to various example embodiments may include an electronic device housing to include an inner area of the electronic device at which a functional component is disposed. The electronic device housing may include a substrate including glass, an insert portion, and an elastic layer disposed between the substrate and the insert portion.

A method of manufacturing (or providing) an electronic device housing according to various example embodiments may include preparing (or providing) an insert portion including at least one of a metal and a ceramic, forming (or providing) an elastic layer on at least one area of a surface of the insert portion, inserting the insert portion and a substrate including glass into a mold, and forming a housing by heating the mold.

According to various example embodiments, an electronic device housing including a substrate including glass, and an insert portion including a material different from that of the substrate may be provided.

According to various example embodiments, an electronic device housing that includes an elastic layer disposed between a substrate and an insert portion and that has an enhanced coupling force by effectively dispersing stress caused by contraction and expansion of the substrate and the insert portion may be provided.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
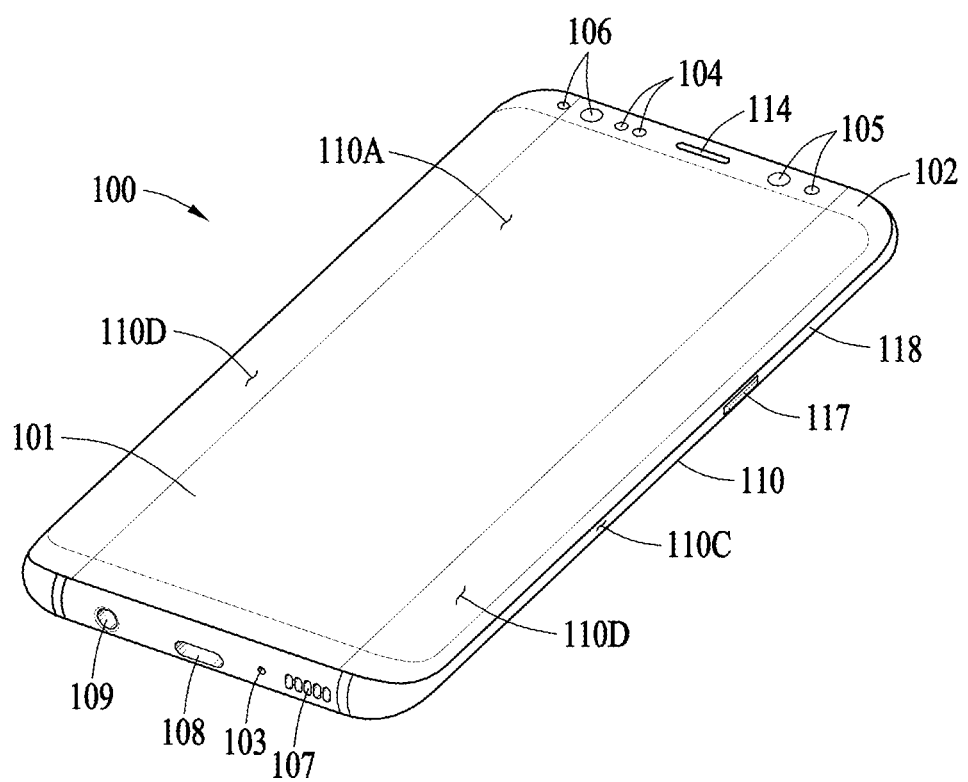
FIG. 1 is a perspective view illustrating a front surface of a mobile electronic device according to an example embodiment.

Hereinafter, example embodiments of the disclosure will be described in detail with reference to the accompanying drawings. When describing the example embodiments with reference to the accompanying drawings, like reference numerals refer to like elements and a repeated description related thereto will be omitted.

FIG. 1 is a perspective view illustrating a front surface of a mobile electronic device according to an example embodiment.

Figure 2:
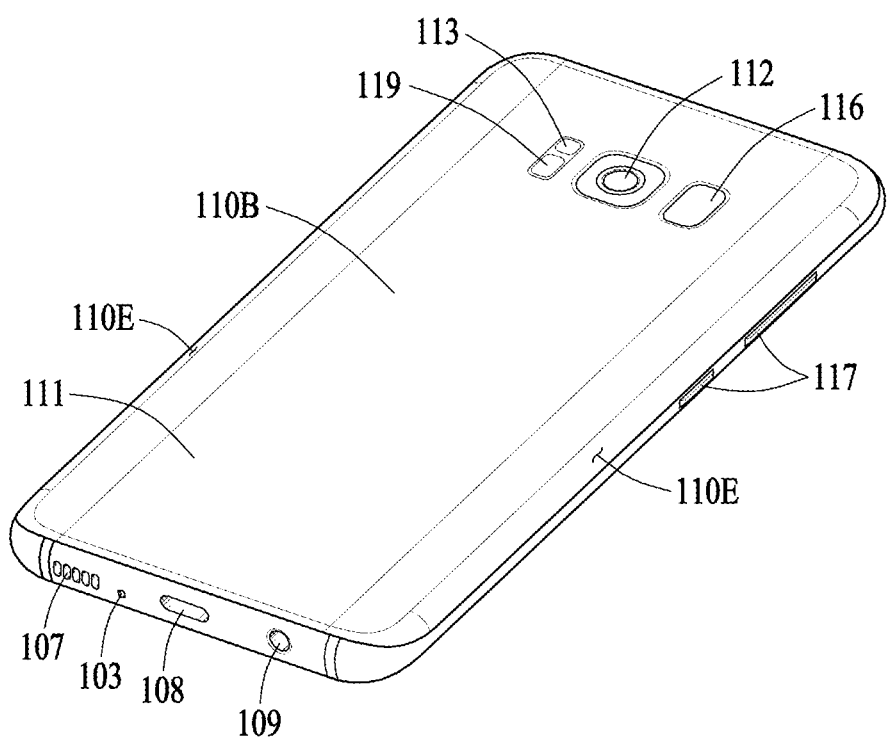
FIG. 2 is a perspective view of a rear surface of the electronic device of FIG. 1.

FIG. 2 is a perspective view of a rear surface of the electronic device of FIG. 1.

Referring to FIGS. 1 and 2, an electronic device 100 according to an example embodiment may include a housing 110 including a first surface (or a front surface) 110A, a second surface (or a rear surface) 110B, and a side surface 110C (e.g., a side portion of the housing) which together surround or define an inner space of the electronic device 200. In an example embodiment (not shown), the housing may also refer to a structure which forms a portion of the first surface 110A, the second surface 110B, and the side surface 110C of FIG. 1. The electronic device and various components or elements thereof may be disposed in (or along) a plane defined by a first direction and a second direction crossing each other. A thickness direction of the electronic device and various components or elements thereof may be defined along a third direction which crosses each of the first and second directions.

According to an example embodiment, the first surface 110A may be formed by a front plate 102 (e.g., a glass plate or a polymer plate including various coating layers) of which at least a portion is substantially transparent. The second surface 110B may be formed of (or provided by) a rear plate 111 that is substantially opaque. For example, the rear plate 111 may be formed of (or include) coated or colored glass, ceramic, polymer, metal materials (e.g. aluminum, stainless steel (SS), or magnesium) or a combination of at least two of the above materials. The side surface 110C may be coupled to the front plate 102 and the rear plate 111 to connect the plates to each other, and may be formed by (or defined by) a side bezel structure (or a "side member") 118 including a metal and/or a polymer. In an example embodiment, the rear plate 111 and the side bezel structure 118 may be integrally formed and may include the same material (e.g., a metal material such as aluminum).

In the illustrated example embodiment, the front plate 102 may include two first areas 110D that are curved and extended seamlessly from the first surface 110A toward the rear plate 111 to define opposing long edges of the front plate 102. In the illustrated example embodiment (see FIG. 2), the rear plate 111 may include two second areas 110E that are curved and extended seamlessly from the second surface 110B toward the front plate 102 to define opposing long edges of the rear plate 111. In some example embodiments, the front plate 102 (or the rear plate 111) may include only one of the first areas 110D (or the second areas 110E). In an example embodiment, some of the first areas 110D or the second area 110E may not be included.

In the above example embodiments, in a side view of the electronic device 100, the side bezel structure 118 may have a first thickness (or width) in a thickness direction, without including a height of the first areas 110D or the second areas 110E, and may have a second thickness along the thickness direction which is less than the first thickness, by including a height of the first areas 110D or the second areas 110E. In an example embodiment, the first areas 110D or the second areas 110E may be formed to be entirely flat instead of being bent or curved at the curve side portions (e.g., the first areas 110D or the second areas 110E) thereof, to form a substantially single plane with the first surface 110A or the second surface 110B.

According to an example embodiment, the electronic device 100 may include at least one of a display 101, audio modules 103, 107, and 114, sensor modules 104, 116, and 119, camera modules 105, 112, and 113, key input devices 117, a light-emitting element 106, and connector holes 108 and 109. In some example embodiments, the electronic device 100 may not include at least one (e.g., the key input devices 117 or the light-emitting element 106) of the components, or may additionally include other components.

The display 101 may be exposed (or visible) from outside the electronic device 100, through, for example, some portions of the front plate 102. The display 101 may generate and/or display an image, generate and/or emit light used for an image, etc., such that the image may be visible from outside the electronic device 100, through a substantial portion of the front plate 102. In some example embodiments, at least a portion of the display 101 may be exposed through the first surface 110A and the front plate 102 constructing the first areas 110D of the side surface 110C, such as to define display areas (e.g., portions of a screen display area) of the electronic device 100 at each of the first surface 110A and the first areas 110D. In some example embodiments, an edge of the display 101 may be formed to be substantially the same as the shape of the periphery of the front plate 102 adjacent thereto. In another example embodiment (not shown), in order to enlarge the exposed area (e.g., planar area) of the display 101, a distance between the edge of the display 101 and the periphery of the front plate 102 may be substantially the same.

In an example embodiment (not shown), a recess or an opening may be formed (or defined) in a portion of a screen display area of the display 101, and at least one of the audio module 114, the sensor module 104, and the camera module 105, and the light-emitting element 106 that are aligned with the recess or the opening, may be included. In an example embodiment (not shown), a rear surface of the screen display area of the display 101 may include at least one of the audio module 114, the sensor module 104, the camera module 105, the sensor module 116 (e.g., a fingerprint sensor), and the light-emitting element 106. In an example embodiment (not shown), the display 101 may be coupled to or disposed adjacent to a touch sensing circuit, a pressure sensor for measuring an intensity (pressure) of a touch, and/or a digitizer for detecting a magnetic-type stylus pen. In some example embodiments, at least a portion of the sensor modules 104 and 119, and/or at least a portion of the key input device 117 may be disposed in the first areas 110D and/or the second areas 110E.

The audio modules 103, 107, and 114 may include a microphone hole (e.g., the audio module 103) and speaker holes (e.g., the audio modules 107 and 114). A microphone for acquiring an external sound may be disposed in the microphone hole (e.g., the audio module 103). In some example embodiments, a plurality of microphones may be disposed to detect a direction of a sound. The speaker holes (e.g., the audio modules 107 and 114) may include an external speaker hole (e.g., the audio module 107), and a receiver hole (e.g., the audio module 114) for a call. In some example embodiments, the speaker holes (e.g., the audio modules 107 and 114) and the microphone hole (e.g., the audio module 103) may be implemented as a single hole, or a speaker (e.g., a piezo speaker) may be included without the speaker holes (e.g., the audio modules 107 and 114). The various holes defined herein may be open to outside the electronic device 200, to deliver or guide an audio sound, to and/or from a component within the electronic device 200.

The sensor modules 104, 116, and 119 may generate an electrical signal or a data value corresponding to an internal operating state of the electronic device 100 or an external environmental state (e.g., outside of the electronic device 100). The sensor modules 104, 116, and 119 may include, for example, a first sensor module 104 (e.g., a proximity sensor) and/or a second sensor module (not shown) (e.g., a fingerprint sensor) disposed on the first surface 110A of the housing 110, and/or a third sensor module 119 (e.g., a heart rate monitoring (HRM) sensor) and/or a fourth sensor module 116 (e.g., a fingerprint sensor) disposed on the second surface 110B of the housing 110. The fingerprint sensor may be disposed on both the first surface 110A (e.g., at the display 101) and the second surface 110B of the housing 110. The electronic device 100 may further include at least one of sensor modules (not shown), for example, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and an illuminance sensor 104.

The camera modules 105, 112, and 113 may include a first camera device 105 disposed on the first surface 110A of the electronic device 100, a second camera device 112 disposed on the second surface 110B, and/or a flash 113. The camera modules 105 and 112 may each include one or more lenses, an image sensor, and/or an image signal processor. The flash 113 may include, for example, a light-emitting diode (LED) or a xenon lamp. In some example embodiments, two or more lenses (e.g., IR camera, wide-angle, and telephoto lenses) and image sensors may be disposed on one surface of the electronic device 100.

The key input device 117 may be disposed on the side surface 110C of the housing 110. In an example embodiment, the electronic device 100 may not include some or all of the above-described key input devices 117. The key input device 117 that is not included may be implemented in another form such as a soft key on the display 101. In some example embodiments, the key input device may include the sensor module 116 disposed on the second surface 110B of the housing 110.

The light-emitting element 106 may be disposed on, for example, the first surface 110A of the housing 110. The light-emitting element 106 may provide, for example, state information of the electronic device 100 in a form of light. In an example embodiment, the light-emitting element 106 may provide, for example, a light source that is linked to an operation of the camera module 105. The light-emitting element 106 may include, for example, an LED, an IR LED, and a xenon lamp.

The connector holes 108 and 109 may include a first connector hole 108 for accommodating a connector (e.g., a universal serial bus (USB) connector) for transmitting and receiving power and/or data to and from an external electronic device, and/or a second connector hole 109 (e.g., an earphone jack) for accommodating a connector for transmitting and receiving an audio signal to and from an external electronic device. The various holes defined herein may be open to outside the electronic device 100, to expose internal components within the electronic device 100 to outside thereof, for connection or interface with a component external to the electronic device 100.

Figure 3:
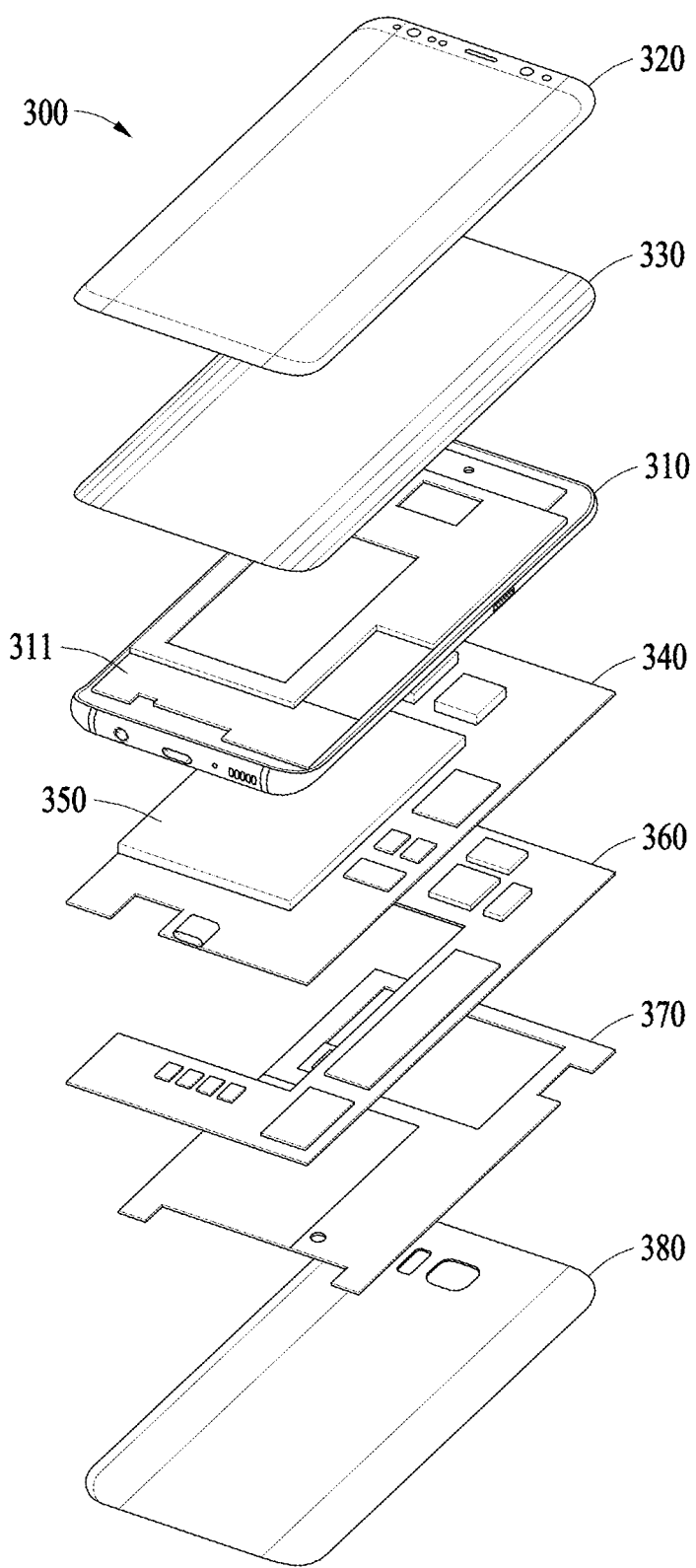
FIG. 3 is an exploded perspective view of the electronic device of FIG. 1.

FIG. 3 is an exploded perspective view of the electronic device of FIG. 1. Referring to FIG. 3, an electronic device 300 may include a side bezel structure 310, a first support member 311 (e.g., a bracket), a front plate 320, a display 330, a printed circuit board (PCB) 340, a battery 350, a second support member 360 (e.g., a rear case), an antenna 370, and a rear plate 380. In some example embodiments, the electronic device 300 may not include at least one (e.g., the first support member 311 or the second support member 360) of the components, or may additionally include other components. At least one of the components of the electronic device 300 may be the same as or similar to at least one of the components of the electronic device 100 of FIG. 1 or 2, and a repeated description thereof will be omitted hereinafter.

The first support member 311 may be disposed inside the electronic device 300 and connected to the side bezel structure 310, or may be formed integrally with the side bezel structure 310. The first support member 311 may be formed of (or include), for example, a metal material and/or a non-metal material (e.g., polymer). The display 330 may be connected to one surface of the first support member 311, and the PCB 340 may be connected to another surface of the first support member 311 which is opposite to the one surface. A processor, a memory, and/or an interface may be mounted on the PCB 340. The processor may include, for example, one or more of a central processing unit, an application processor, a graphics processing unit, an image signal processor, a sensor hub processor, and a communication processor.

The memory may include, for example, a volatile memory or a non-volatile memory.

The interface may include, for example, a high-definition multimedia interface (HDMI), a USB interface, a secure digital (SD) card interface, or an audio interface. For example, the interface may electrically or physically connect the electronic device 300 to an external electronic device, and may include a USB connector, an SD card/multimedia card (MMC) connector, or an audio connector.

The battery 350, which is a device for supplying power to at least one component of the electronic device 300, may include, for example, a primary cell that is not rechargeable, a secondary cell that is rechargeable, or a fuel cell. For example, at least a portion of the battery 350 may be disposed on substantially the same plane as the PCB 340. The battery 350 may be disposed integrally inside the electronic device 300, or disposed detachably from the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or may wirelessly transmit and receive power required for charging to and from the external device. In an example embodiment, an antenna structure may be formed by a portion of the side bezel structure 310 and/or the first support member 311 or a combination thereof. The electronic device 100 according to various example embodiments of the present disclosure may include an electronic device such as a bar type, a foldable type, a rollable type, a slidable type, a wearable type, and a tablet personal computer (PC) and/or a notebook PC. The electronic device 100 according to various example embodiments of the present disclosure is not limited to the above-described example, and may include various other electronic devices.

Figure 4:
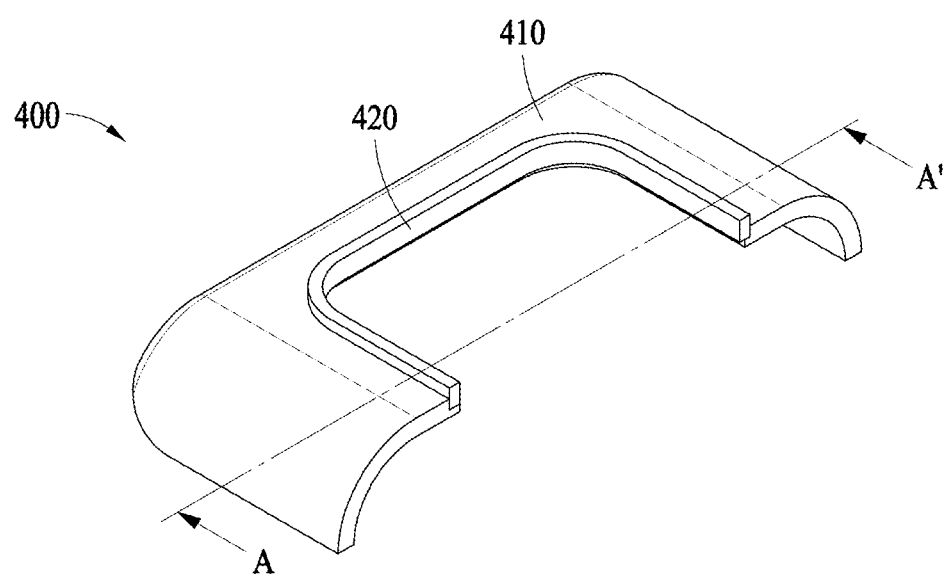
FIG. 4 is a partial perspective view of an electronic device housing according to an example embodiment.

FIG. 4 is a partial perspective view of an electronic device housing according to various example embodiments.

FIG. 4 is an enlarged view of a portion of an electronic device housing 400 (e.g., the front plate 320 and/or the rear plate 380 as a housing 400 of FIG. 3). In the following description, an electronic device housing may also be referred to as a "housing". Referring to FIG. 4, the housing 400 may include a substrate 410 and an insert portion 420.

According to various example embodiments, a front plate (e.g., the front plate 320 of FIG. 3) or a rear plate (e.g., the rear plate 380 of FIG. 3) may include a cavity area in which various modules (e.g., the camera modules 105, 112, and 113, the sensor modules 103, 116, and 119, and the audio module 114 of FIGS. 1 and 2) are accommodated.

Referring to FIG. 4, the housing 400 may include the substrate 410 (e.g., housing body), the insert portion 420, and an elastic layer (not shown) disposed in (or at) an interface between the substrate 410 and the insert portion 420. According to various example embodiments, the housing 400 may have a shape that may provide a space in which various modules (e.g., the camera modules 112 and 113 and the sensor modules 116 and 119 of FIG. 2) are, where the space is defined by the substrate 410 together with the insert portion 420. According to various example embodiments, the substrate 410 and the insert portion 420 may include different materials, and the housing 400 may include (or define) both the substrate 410 and the insert portion 420 to be integrally formed with each other.

According to various example embodiments, the substrate 410 may include glass. According to various example embodiments, the housing 400 may be a molded element which is molded at a melting point of the glass included in the substrate 410 or greater, and the substrate 410 may be formed integrally with the insert portion 420.

According to various example embodiments, the insert portion 420 may include at least one of a metal and a ceramic. According to various example embodiments, the insert portion 420 may include at least one of stainless steel, titanium, an aluminum alloy, and ceramic. The insert portion 420 may have a coefficient of expansion greater than that of the substrate 410. According to various example embodiments, the insert portion 420 may include stainless steel, for example, Steel Use Stainless 304L and/or Steel Use Stainless 316L. According to various example embodiments, the insert portion 420 may include low-carbon stainless steel. According to various example embodiments, the insert portion 420 may include an aluminum alloy, and a heat-resistant coating layer including at least one of tantalum carbide (TaC) and silicon carbide (SiC) may be formed on a surface of the aluminum alloy.

Figure 5:
FIG. 5 is a partial cross-sectional view of an electronic device housing according to an example embodiment.

FIG. 5 is a partial cross-sectional view of an electronic device housing according to various example embodiments.

FIG. 5 illustrates a cross section of a housing 500 of an electronic device taken along line A-A' of FIG. 4.

According to various example embodiments, the housing 500 (e.g., the housing 400 of FIG. 4) may include a substrate 510 (e.g., the substrate 410 of FIG. 4), an insert portion 520 (e.g., the insert portion 420 of FIG. 4), and an elastic layer 530. According to various example embodiments, the elastic layer 530 may be disposed between the substrate 510 and the insert portion 520 and may be formed to cover at least a portion of the insert portion 520. An end of the insert portion 520 may extend further than a bottom surface of the substrate 510 and/or the elastic layer 530 (e.g., in a direction toward the inside of the housing 500), to be exposed outside of these elements and disposed at an inner area of the housing 500. According to various example embodiments, the housing 500 may be cast using a mold, to be a molded element. The housing 500 may be formed such that the substrate 510 may enclose the insert portion 520 by using glass in a mold having the insert portion 520 therein.

According to various example embodiments, a thickness of the elastic layer 530 may be determined based on an amount of expansion of the substrate 510 and an amount of expansion of the insert portion 520 during mold casting. According to various example embodiments, the thickness of the elastic layer 530 may be about 1.5 to 10 times greater than a sum of the amount of expansion of the substrate 510 and the amount of expansion of the insert portion 520. Here, the amount of expansion of each of the substrate 510 and the insert portion 520 may be calculated as a product of each coefficient of expansion, an initial size (before expansion), and a change in temperature. According to various example embodiments, the coefficient of expansion may be a coefficient of linear expansion. According to various example embodiments, the thickness of the elastic layer 530 may range from about 0.5 millimeter (mm) to about 10 millimeters (mm), but is not limited thereto.

According to various example embodiments, the elastic layer 530 may be disposed at an interface between the substrate 510 and the insert portion 520. The elastic layer 530 may be disposed between the substrate 510 and the insert portion 520, such as to form an interface with each of these elements. According to various example embodiments, the elastic layer 530 may be disposed between the substrate 510 and the insert portion 520 to reduce or accommodate expansion and contraction of elements of the housing 500 according to a temperature of the substrate 510 and the insert portion 520. According to various example embodiments, the elastic layer 530 may prevent separation of the substrate 510 and the insert portion 520 from each other, by dispersing an external impact (e.g., an impact due to dropping), and may have a high adhesion to prevent the insert portion 520 from being separated from other components or elements of the housing 500.

According to various example embodiments, the substrate 510 and the insert portion 520 may have different contraction and expansion rates according to a temperature, and the elastic layer 530 may be disposed between the substrate 510 and the insert portion 520. Accordingly, it is possible to prevent the insert portion 520 from being fitted into a mold during a method of providing the housing, and to prevent damage and/or separation of the substrate 510 and the insert portion 520 by dispersing accumulated fatigue due to contraction and expansion according to a use environment of the electronic device (e.g., use at a high temperature, use at a low temperature). According to various example embodiments, the elastic layer 530 may prevent damage and/or separation of the substrate 510 and the insert portion 520 from each other, by dispersing fatigue and stress caused by frequent impacts and vibrations of the electronic device.

According to various example embodiments, the substrate 510 may include glass, and a softening point (e.g., softening temperature) of the glass included in the substrate 510 may be about 750 degrees Celsius (° C.) or less. Unlike a melting point or a glass transition temperature, the softening point may correspond to a stage before a specimen or material begins to melt, and may be measured as, for example, a Vicat softening point (VST) (ASTM D 1525), a heat distortion temperature (HDT) (ASTM D 648), or a TMA softening point (ASTM E 2347).

According to various example embodiments, the glass included in the substrate 510 may have a softening point of about 750° C. or less, about 740° C. or less, about 730° C. or less, about 720° C. or less, about 710° C. or less, about 700° C. or less, about 690° C. or less, about 680° C. or less, about 670° C. or less, about 660° C. or less, or about 650° C. or less. According to various example embodiments, the substrate 510 may be manufactured by molding glass having a softening point of about 750° C. or less, under a high temperature and a high pressure of a process for providing the housing.

According to various example embodiments, the substrate 510 may include a metal oxide and/or a ceramic oxide. According to various example embodiments, the substrate 510 may include about 5% by weight (wt %) to about 35 wt % of at least one of $Al_2O_3$, $Li_2O$, $Na_2O$, and $B_2O_3$, relative to a total weight of the substrate 510 According to various example embodiments, the substrate 510 may include at least one of $Al_2O_3$, $Li_2O$, and $Na_2O$. According to an example embodiment, in the substrate 510, $Al_2O_3$ may be included in an amount of about 15 wt % to about 25 wt %, $Li_2O$ may be included in an amount of about 2 wt % to about 10 wt %, and $Na_2O$ may be included in an amount of about 5 wt % to about 15 wt %.

According to various example embodiments, the substrate 510 may further include $B_2O_3$ to reduce the melting point of the substrate 510 and increase rigidity of the substrate 510. According to various example embodiments, the substrate 510 may include about 3 wt % to about 20 wt % of $B_2O_3$. According to various example embodiments, the substrate 510 may include a XensationUp™ manufactured by Schott.

According to various example embodiments, the substrate 510 may be formed of glass including a metal oxide and/or a ceramic oxide. According to various example embodiments, the glass included in the substrate 510 may include at least one additive element among $Al_2O_3$, $Li_2O$, $Na_2O$, and $B_2O_3$, and a remainder thereof may include $SiO_2$.

According to various example embodiments, a difference in the coefficient of expansion between the substrate 510 and the insert portion 520 may be $10 \times 10^{-6}$ m/(m° C.) or greater. According to various example embodiments, the substrate 510 may have a coefficient of expansion less than that of the insert portion 520. According to an embodiment, the coefficient of expansion of the substrate 510 may range from about $5 \times 10^{-6}$ m/(m ° C.) to $10 \times 10^{-6}$ m/(m ° C.), and the coefficient of expansion of the insert portion 520 may range from about $15 \times 10^{-6}$ m/(m ° C.) to about $25 \times 10^{-6}$ m/(m ° C.). According to various example embodiments, the substrate 510 and the insert portion 520 may have different coefficients of expansion from each other, and stress generated between the substrate 510 and the insert portion 520 due to a difference in an expansion rate according to a temperature may be reduced or absorbed by the elastic layer 530. According to various example embodiments, the coefficient of expansion may be a coefficient of linear expansion.

According to various example embodiments, the coefficient of expansion of the substrate 510 may be about 0.4 times to about 0.8 times the coefficient of expansion of the insert portion 520. According to various example embodiments, a ratio of the coefficient of expansion of the substrate 510 to the coefficient of expansion of the insert portion 520 may be in a range of about 1:1.2 to about 1:2.5.

According to various example embodiments, the substrate 510 and the insert portion 520 may not come into physical contact with each other, e.g., may be spaced apart from each other by facing or being adjacent to each other with an intervening element therebetween (e.g., a gap, a layer like the elastic layer 530, etc.). According to various example embodiments, the elastic layer 530 may cover at least a portion of a surface of the insert portion 520, such as an outer surface which faces or is closest to the substrate 510. The elastic layer 530 may be applied to the insert portion 520 to completely cover a surface of the insert portion 520 which faces or corresponds to the substrate 510, so that the substrate 510 and the insert portion 520 may not substantially contact each other or may not form a direct interface therebetween.

According to various example embodiments, the elastic layer 530 may include at least one of silicon and ceramic fiber. According to various example embodiments, the elastic layer 530 may be excellent in heat resistance against a high temperature due to a high melting point thereof. In addition, since the melting point of the elastic layer 530 is greater than that of the glass included in the substrate 510, the elastic layer 530 may not be melted in a process of forming or molding the glass in a housing.

According to various example embodiments, the elastic layer 530 may have various colors. According to various example embodiments, the elastic layer 530 may be transparent or may have a color. According to various example embodiments, the elastic layer 530 may have a color similar to that of the insert portion 520, and accordingly a color of an exterior of the housing 500 may gradually change. An outer surface of the substrate 510 may define an outer surface of the housing 500 (or the electronic device), where the outer surface is exposed to outside the electronic device. According to various example embodiments, the elastic layer 530 may have a color contrasting with the insert portion 520, and accordingly an exterior of the insert portion 520 may be visually emphasized in the electronic device housing 500. According to various example embodiments, by adjusting the color of the elastic layer 530, an aesthetic appearance of the housing 500 and an electronic device which includes the housing 500 may be improved to increase a sense of beauty of the appearance of the electronic device. According to various example embodiments, the elastic layer 530 may include a transparent silicone resin and/or ceramic fibers. The elastic layer 530 may be manufactured (or provided) to be transparent or have various colors using opaque ink (e.g., acrylic ink).

According to various example embodiments, the elastic layer 530 may be disposed between the substrate 510 and the insert portion 520, and a portion of the surface of the insert portion 520 or a surface of the insert portion 520 on which the elastic layer 530 is formed, may be surface-treated to have an average surface roughness Ra of about 0.1 micrometer (μm) to about 20 micrometers (μm). According to various example embodiments, a surface treatment of the insert portion 520 may be performed using a mechanical surface treatment scheme such as blasting and/or hairline. According to various example embodiments, a roughness may be provided to the insert portion 520 by performing the surface treatment on an outer surface of the insert portion 520, thereby strengthening an adhesion force between the substrate 510 and the insert portion 520 to more stably bond and fix these elements to each other.

According to various example embodiments, the elastic layer 530 may include a heat-resistant coating layer on a surface of the elastic layer 530, and the heat-resistant coating layer may include at least one of TaC and SiC. According to various example embodiments, at least one of TaC and SiC may have a melting point of about 2500° C. or greater, which may be greater than a melting point of the glass included in the substrate 510. According to various example embodiments, the elastic layer 530 may include silicon and/or ceramic fibers, and may include a heat-resistant coating layer that includes at least one of TaC and SiC and is formed on the surface of the elastic layer 530. According to various example embodiments, the elastic layer 530 may include silicon and ceramic fibers, and an elastic modulus of the elastic layer 530 may be determined by controlling an amount of silicon and ceramic fibers included in the elastic layer 530, based on an amount of expansion and contraction of the substrate 510 and the insert portion 520. According to various example embodiments, the elastic layer 530 may have a melting point of about 1500° C. or greater and an elastic modulus of 200 gigpascals (GPa) or greater.

According to various example embodiments, the elastic layer 530 may include a heat-resistant material, and may include a high-temperature resistant elastic coating on the surface of the elastic layer 530. According to various example embodiments, the elastic layer 530 may include a carbon fiber and an elastic liquid.

Figure 6:
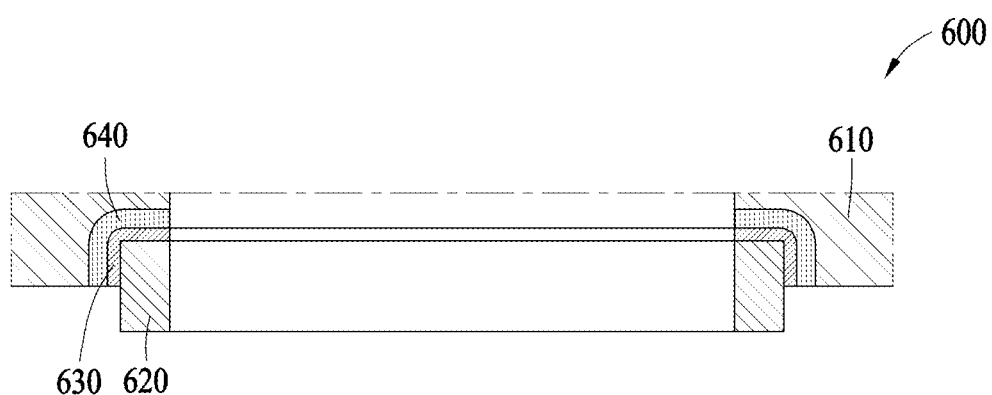
FIG. 6 is a partial cross-sectional view of an electronic device housing according to an example embodiment.

FIG. 6 is a partial cross-sectional view of an electronic device housing according to various example embodiments.

FIG. 6 illustrates a cross section of a housing 600 of an electronic device taken along line A-A' of FIG. 4.

According to various example embodiments, the housing 600 (e.g., the housing 500 of FIG. 5) may include a substrate 610 (e.g., the substrate 510 of FIG. 5), an insert portion 620 (e.g., the insert portion 520 of FIG. 5), an elastic layer 630 (e.g., the elastic layer 530 of FIG. 5), and an adhesive layer 640. According to various example embodiments, the adhesive layer 640 may be disposed between the substrate 610 and the elastic layer 630. Desirably, the adhesive layer 640 may be formed on a surface of the elastic layer 630 that is in contact with (or faces) the substrate 610, so that the substrate 610 and the elastic layer 630 may not substantially contact each other.

According to various example embodiments, the adhesive layer 640 may include a glass powder. The glass powder may be excellent in mechanical strength and chemical durability and may be used to bond and/or attach glass and metal to each other, to enhance a coupling force between the substrate 610 and the insert portion 620. According to various example embodiments, the adhesive layer 640 may have a glass transition temperature of about 370° C. to about 700° C. According to various example embodiments, the glass powder included in the adhesive layer 640 may have a glass transition temperature of about 370° C. to about 700° C. According to various example embodiments, the glass powder may further include at least one ceramic oxide selected from $Bi_2O_3$, $B_2O_3$, BaO, ZnO, $Al_2O_3$ and $P_2O_5$, in addition to silica ($SiO_2$).

Figure 7A:
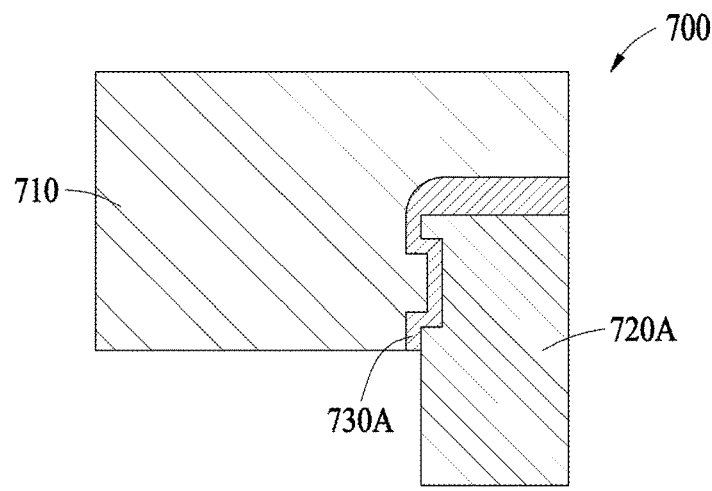
FIGS. 7A through 7C are partial cross-sectional views of an electronic device housing according to various example embodiments.
Figure 7B:
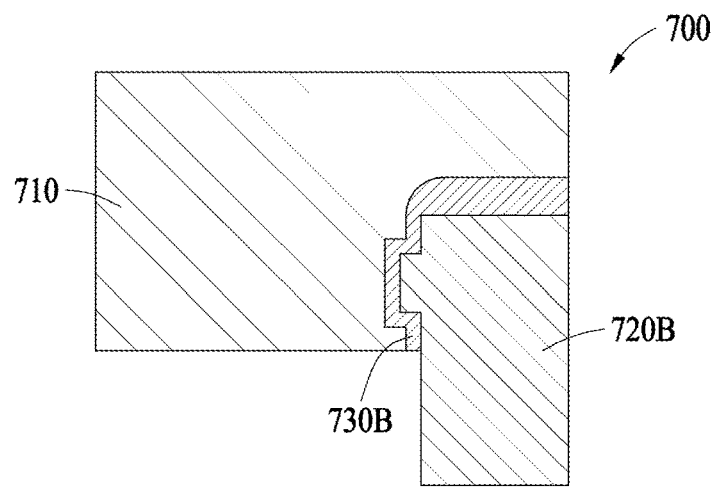
Figure 7C:
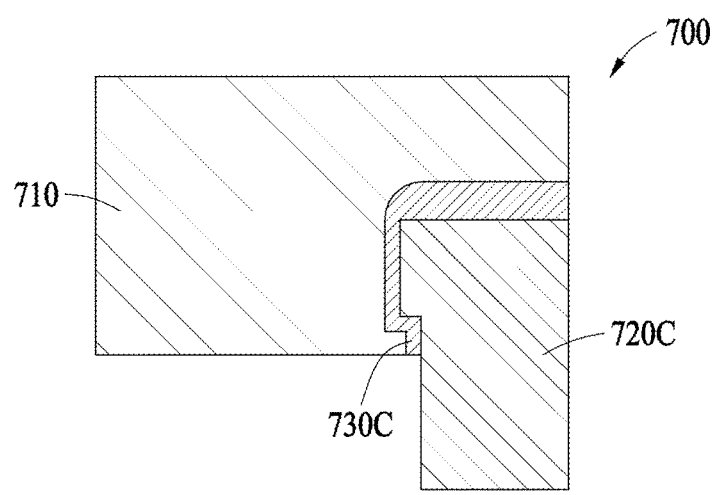

FIGS. 7A through 7C are partial cross-sectional views of an electronic device housing according to various example embodiments.

FIGS. 7A through 7C illustrate examples of a cross section of a housing 700 of an electronic device taken along line A-A' of FIG. 4.

According to various example embodiments, the housing 700 (e.g., the housing 500 of FIG. 5) may include a substrate 710 (e.g., the substrate 510 of FIG. 5), an insert portion 720A, 720B, 720C (e.g., the insert portion 520 of FIG. 5), and an elastic layer 730A, 730B, 730C (e.g., the elastic layer 530 of FIG. 5). According to various example embodiments, a shape of the elastic layer 730A, 730B, 730C may be determined based on a surface shape of the substrate 710 on which an elastic layer is formed, and/or a surface shape of the insert portion 720A, 720B, 720C. An inner surface of the substrate 710 which is closest to and faces the insert portion 720A, 720B, 720C, has an uneven profile (e.g., recess/protrusion, stepped structure, etc.) and the outer surface of the insert portion 720A, 720B, 720C which is closest to and faces the substrate 710, has an uneven profile corresponding to that of the substrate 710. Accordingly, the elastic layer 730A, 730B, 730C may include an uneven portion corresponding to the facing surfaces of the housing substrate and housing insert portion.

According to various example embodiments, an uneven portion formed along the inner and/or outer surfaces of the elastic layer 730A, 730B, 730C may have various shapes to prevent the insert portion 720A, 720B, 720C from being separated from the substrate 710. The uneven portion may be formed in a direction from the substrate 710 toward the insert portion 720A or in a direction from the insert portion 720B toward the substrate 710. Referring to FIG. 7A, the insert portion 720A may include a side uneven portion recessed inwardly in a direction from the substrate 710 and to the insert portion 720A, and the elastic layer 730A may include an uneven portion corresponding to a shape of the side uneven portion. Referring to FIG. 7B, the insert portion 720B may include a side uneven portion protruding outwardly in a direction from the insert portion 720B to the substrate 710, and the elastic layer 730B may include an uneven portion corresponding to a shape of the side uneven portion. Referring to FIG. 7C, the insert portion 720C may be formed in a flange type in which a cross-sectional area of an end portion of the substrate 710 increases at a bottom surface thereof, a cross-sectional area of an end portion of the insert portion 710C decreases at a bottom surface thereof, and the elastic layer 730B may include an uneven portion corresponding to a shape of the insert portion 720C of the flange type. The uneven portions of the above-described elements may increase a contact surface or interface surfaces between adjacent elements, to increase a bonding strength therebetween.

Figure 8A:
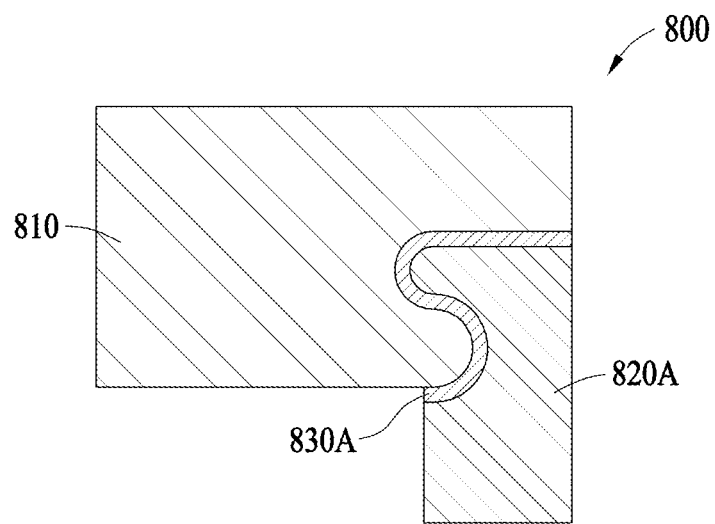
FIGS. 8A and 8B are partial cross-sectional views of an electronic device housing according to various example embodiments.
Figure 8B:
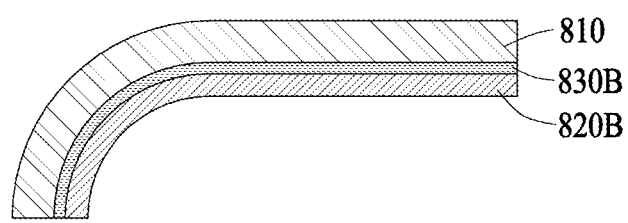

FIGS. 8A and 8B are partial cross-sectional views of an electronic device housing according to various example embodiments.

FIGS. 8A and 8B illustrate examples of a cross section of a housing 800 of an electronic device taken along line A-A' of FIG. 4.

According to various example embodiments, the housing 800 (e.g., the housing 500 of FIG. 5) may include a substrate 810 (e.g., the substrate 510 of FIG. 5), an insert portion 820A, 820B (e.g., the insert portion 520 of FIG. 5), and an elastic layer 830A, 830B (e.g., the elastic layer 530 of FIG. 5).

Referring to FIGS. 8A and 8B, the insert portion 820A, 820B may have a curved surface to disperse stress due to contraction and expansion of the substrate 810 and the insert portion 820A, 820B which are coupled to each other. According to various example embodiments, the elastic layer 830A, 830B may be formed along the curved surface of the insert portion 820A, 820B, so that the insert portion 820A, 820B and the substrate 810 may not contact each other.

Referring to FIG. 5 to FIG. 8B, an expansion-absorbing (or impact-absorbing) layer such as the various elastic layers described above, may be disposed outside of a thickness of the respective substrate the respective insert portion which faces the respective substrate. That is, a substrate (e.g., the substrate 510 of FIG. 5), an elastic layer (e.g., the elastic layer 530 of FIG. 5) and an insert portion (e.g., the insert portion 520 of FIG. 5) may be arranged in order along a thickness direction of the housing (e.g., the housing 500 of FIG. 5). However, the invention not limited thereto. In embodiments, a respective elastic layer and respective insert portion may be contained within a thickness of a respective substrate, such as to be arranged adjacent to each other along a plane of the respective housing.

Figure 9:
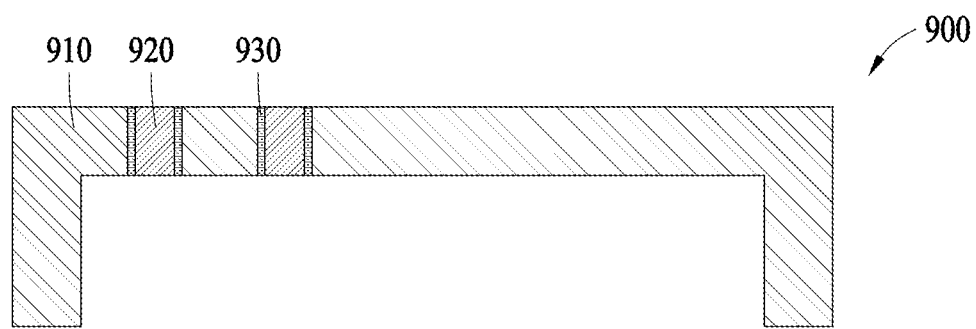
FIG. 9 is a partial cross-sectional view of an electronic device housing according to an example embodiment.

FIG. 9 is a partial cross-sectional view of an electronic device housing according to various example embodiments.

FIG. 9 illustrates a cross section of a housing 900 of an electronic device taken along line A-A' of FIG. 4.

According to various example embodiments, the housing 900 (e.g., the housing 500 of FIG. 5) may include a substrate 910 (e.g., the substrate 510 of FIG. 5), an insert portion 920 (e.g., the insert portion 520 of FIG. 5), and an elastic layer 930 (e.g., the elastic layer 530 of FIG. 5). The substrate 910 may have a thickness defined between an outer surface thereof and an inner surface thereof which is opposite to the outer surface. According to various example embodiments, the insert portion 920 may penetrate the substrate 910. That is, the insert portion 920 may be within a thickness of the substrate 910. A first end and/or a second end opposite to the first end, of the insert portion 920, may be exposed to outside the housing 900 at the upper surface and second surface thereof, respectively.

The insert portion 920 may have a side surface extending between the first end (or first surface) and the second end (or second surface) and connecting the opposing ends to each other. According to various example embodiments, the elastic layer 930 may be formed to cover at least a portion of a side surface of the insert portion 920. In a direction along the housing 900, the elastic layer 930 may be disposed between the substrate 910 and the insert portion 920. The housing 900 may include the insert portion 920 (or insert pattern) provided in plural including a plurality of insert portions 920. The housing 900 may further include the elastic layer 930 (or elastic pattern) provided in plural including a plurality of elastic layers 930 which face each other with a respective insert portion 920 therebetween. One or more of an expansion-absorbing (or impact-absorbing) member including the insert portion 920 together with the elastic layer 930, may be provided within the substrate 910 of the housing 900. Accordingly, portions of the substrate 910, and the insert portion 920, may not substantially be in physical contact with each other.

According to various example embodiments, the substrate glass may have a softening point of about 750° C. or less.

According to various example embodiments, a substrate (e.g., the substrate 510 of FIG. 5) may include about 5 wt % to about 35 wt % of at least one of $Al_2O_3$, $Li_2O$, $Na_2O$, and $B_2O_3$.

According to various example embodiments, an insert portion (e.g., the insert portion 520 of FIG. 5) may include at least one of a metal oxide and a ceramic oxide.

According to various example embodiments, a difference in a coefficient of expansion between the substrate (e.g., the substrate 510 of FIG. 5) and the insert portion (e.g., the insert portion 520 of FIG. 5) may be greater than or equal to about $10 \times 10^{-6}$ m/(m).

According to various example embodiments, a coefficient of expansion of the substrate (e.g., the substrate 510 of FIG. 5) may be about 0.4 times to about 0.8 times a coefficient of expansion of the insert portion (e.g., the insert portion 520 of FIG. 5).

According to various example embodiments, the substrate (e.g., the substrate 510 of FIG. 5) and the insert portion (e.g., the insert portion 520 of FIG. 5) may not come into physical contact with each other.

According to various example embodiments, a housing of an electronic device may further include an adhesive layer (e.g., the adhesive layer 640 of FIG. 6) disposed between the substrate (e.g., the substrate 610 of FIG. 6) and an elastic layer (e.g., the elastic layer 630 of FIG. 6). The adhesive layer (e.g., the adhesive layer 640 of FIG. 6) may have a glass transition temperature of about 370° C. to about 700° C.

According to various example embodiments, the elastic layer (e.g., the elastic layer 530 of FIG. 5) may include an uneven portion.

According to various example embodiments, the elastic layer (e.g., the elastic layer 530 of FIG. 5) may have a curved surface.

According to various example embodiments, the elastic layer (e.g., the elastic layer 530 of FIG. 5) may include at least one of silicon and ceramic fiber.

According to various example embodiments, the elastic layer (e.g., the elastic layer 530 of FIG. 5) may include a heat-resistant coating layer on a surface of the elastic layer, and the heat-resistant coating layer may include at least one of TaC and SiC.

According to various example embodiments, the elastic layer (e.g., the elastic layer 530 of FIG. 5) may have a melting point of about 1500° C. or greater and an elastic modulus of 200 GPa or greater.

According to various example embodiments, the insert portion (e.g., the insert portion 520 of FIG. 5) may penetrate the substrate (e.g., the substrate 510 of FIG. 5), such as to expose one or more end of the insert portion to outside the substrate.

According to various example embodiments, a portion of the insert portion (e.g., the insert portion 520 of FIG. 5) which faces the elastic layer (e.g., the elastic layer 530 of FIG. 5), may be surface-treated to have an average surface roughness Ra of about 0.1 µm to about 20 µm.

According to various example embodiments, an electronic device that is fully or partially enclosed by a housing (e.g., the housing 400 of FIG. 4, the housing 500 of FIG. 5, the housing 600 of FIG. 6, the housing 700 of FIGS. 7A through 7C, the housing 800 of FIGS. 8A and 8B, or the housing 900 of FIG. 9) may be provided. The electronic device according to various example embodiments may include the housing (e.g., the housing 400 of FIG. 4, the housing 500 of FIG. 5, the housing 600 of FIG. 6, the housing 700 of FIGS. 7A through 7C, the housing 800 of FIGS. 8A and 8B, or the housing 900 of FIG. 9) to include an inner area of the electronic device at which various components or layers of the electronic device are received. The housing (e.g., the housing 400 of FIG. 4, the housing 500 of FIG. 5, the housing 600 of FIG. 6, the housing 700 of FIGS. 7A through 7C, the housing 800 of FIGS. 8A and 8B, or the housing 900 of FIG. 9) may include a substrate (e.g., the substrate 410 of FIG. 4, the substrate 510 of FIG. 5, the substrate 610 of FIG. 6, the substrate 710 of FIGS. 7A through 7C, the substrate 810 of FIGS. 8A and 8B, or the substrate 910 of FIG. 9) including glass, an insert portion (e.g., the insert portion 420 of FIG. 4, the insert portion 520 of FIG. 5, the insert portion 620 of FIG. 6, the insert portion 720A, 720B, 720C of FIGS. 7A through 7C, the insert portion 820A, 820B of FIGS. 8A and 8B, or the insert portion 920 of FIG. 9), and an elastic layer (e.g., the elastic layer 530 of FIG. 5, the elastic layer 630 of FIG. 6, the elastic layer 730A, 730B, 730C of FIGS. 7A through 7C, the elastic layer 830A, 830B of FIGS. 8A and 8B, or the elastic layer 930 of FIG. 9) disposed between the substrate and the insert portion and formed to cover at least a portion of the insert portion.

Figure 10:
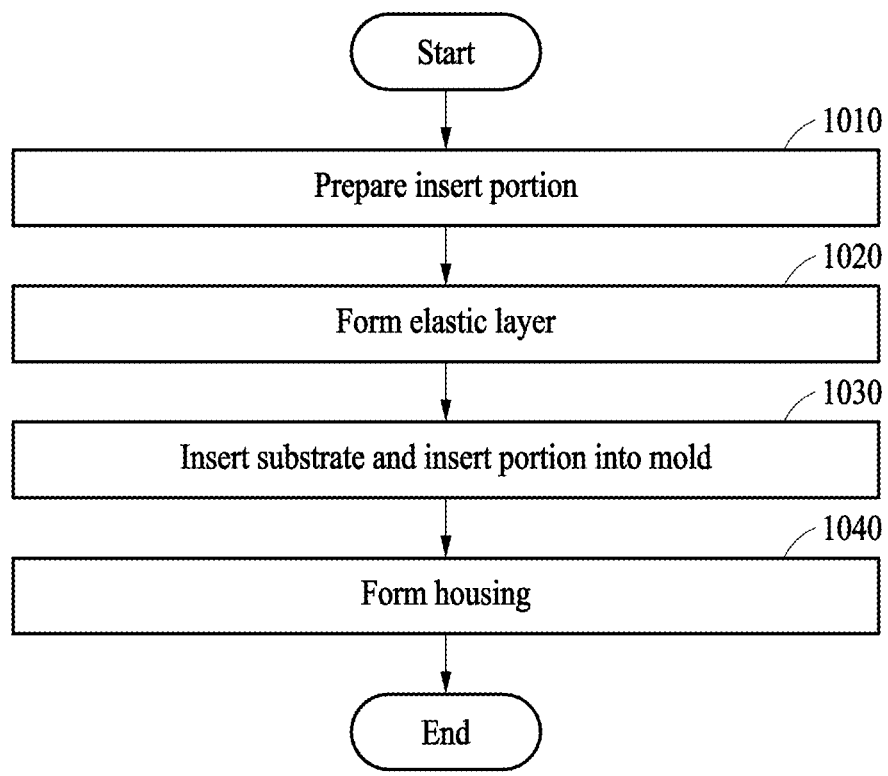
FIG. 10 is a flowchart illustrating a method of manufacturing an electronic device housing according to an example embodiment.

FIG. 10 is a flowchart illustrating a method of manufacturing (or providing) an electronic device housing according to various example embodiments. In an example embodiment, the method may include providing a substrate including glass and a component location corresponding to a functional component of an electronic device having the electronic device housing, providing an insert portion including a metal or a ceramic and a surface at which the insert portion is bonded to the substrate comprising glass, providing an elastic layer on the surface of the insert portion at which the insert portion is bonded to the substrate including glass, providing the insert portion corresponding to the component location of the substrate, and the substrate including glass, into a mold, and providing the electronic device housing by heating the mold having the insert portion corresponding to the component location of the substrate, and the substrate including glass, therein.

The method of FIG. 10 may include operation 1010 of preparing an insert portion including at least one of a metal and a ceramic, operation 1020 of forming an elastic layer on at least one area of a surface of the insert portion, operation 1030 of inserting the insert portion and a substrate including glass, into a mold, and operation 1040 of forming a housing by heating the mold.

According to various example embodiments, the insert portion may include at least one of stainless steel, titanium, and ceramic, and may be designed such that various components (e.g., the camera modules 105, 112, and 113, the sensor modules 103, 116, and 119, and the audio module 114 of FIGS. 1 and 2) of an electronic device may be installed in the insert portion.

According to various example embodiments, a substrate (e.g., the substrate 410 of FIG. 4, the substrate 510 of FIG. 5, the substrate 610 of FIG. 6, the substrate 710 of FIGS. 7A through 7C, the substrate 810 of FIGS. 8A and 8B, or the substrate 910 of FIG. 9) of a housing (e.g., the housing 400 of FIG. 4, the housing 500 of FIG. 5, the housing 600 of FIG. 6, the housing 700 of FIGS. 7A through 7C, the housing 800 of FIGS. 8A and 8B, or the housing 900 of FIG. 9) may define an opening or a colored-frame corresponding to a functional component (e.g., audio modules 103, 107, and 114, sensor modules 104, 116, and 119, camera modules 105, 112, and 113, key input devices 117, a light-emitting element 106, and connector holes 108 and 109). An insert portion (e.g., the insert portion 420 of FIG. 4, the insert portion 520 of FIG. 5, the insert portion 620 of FIG. 6, the insert portion 720A, 720B, 720C of FIGS. 7A through 7C, the insert portion 820A, 820B of FIGS. 8A and 8B, or the insert portion 920 of FIG. 9) may extend along the opening or define the frame around the area occupied by the various module, sensor, hole, opening, etc., without being limited thereto.

According to various example embodiments, operation 1020 of forming the elastic layer may be performed in consideration of operation 1040 of forming the housing that is a post process. Accordingly, the elastic layer may be formed on at least one area of the surface of the insert portion. According to various example embodiments, in operation 1040 of forming the housing, the elastic layer may be formed on a surface of the insert portion that faces the substrate and may contact the substrate. According to various example embodiments, the elastic layer may be formed to suppress or prevent separation of the substrate and the insert portion from each other due to contraction and expansion of the substrate and the insert portion, and/or an external impact (e.g., an impact due to dropping). According to various example embodiments, the elastic layer may be in contact with the substrate and the insert portion at the same time.

According to various example embodiments, operation 1030 of inserting the insert portion and the substrate including the glass, into the mold, may be performed based on a coefficient of thermal expansion of each of the substrate and the insert portion. According to various example embodiments, the mold may include another insertion part into which the insert portion is to be installed.

Figure 11:
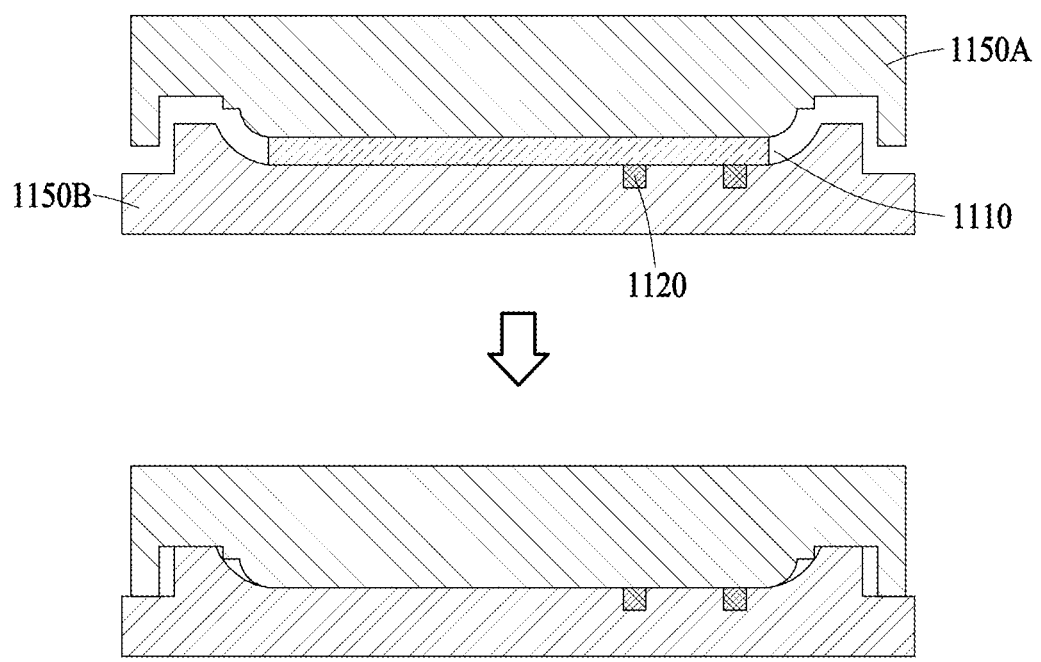
FIG. 11 is a diagram illustrating an example of forming an electronic device housing according to an example embodiment.

FIG. 11 is a diagram illustrating an example of forming an electronic device housing according to various example embodiments.

Referring to FIG. 11, an operation (e.g., operation 1040 of FIG. 10) of forming a housing of an electronic device may be performed. According to various example embodiments, operation 1040 of forming the housing may be performed by melting (or softening) the substrate by heating the mold, or additionally applying a pressure such that an upper mold 1150A and a lower mold 1150B facing each other, move toward each other such as to be in contact with each other. According to various example embodiments, the mold may include the upper mold 1150A and the lower mold 1150B, and an inner shape of the lower mold 1150B may be designed to correspond to an inner shape the upper mold 1150A.

According to various example embodiments, the lower mold 1150B may include a separate insertion part into which an insert portion 1120 is installed. The separate insertion part may be a recess at an inner area of the lower mold 1150B. The insert portion 1120 may be inserted into the lower mold 1150B, and a substrate 1110 including glass may be mounted on the insert portion 1120 as a preliminary substrate. According to various example embodiments, an elastic layer (not shown) may be formed on at least one area of a surface of the insert portion 1120.

According to various example embodiments, the substrate 1110 may be coupled integrally with the insert portion 1120 by heating and melting the substrate 1110 through operation 1040. According to various example embodiments, the substrate 1110 may desirably include glass, and may include various additive elements (e.g., $Al_2O_3$, $Li_2O$, $Na_2O$, and $B_2O_3$) to reduce a viscosity and a softening point of the glass.

According to various example embodiments, operation 1040 of forming the housing may be performed by heating and pressing the mold. According to various example embodiments, the mold in which the insert portion 1120 and the substrate 1110 are inserted may be put into a separate heat treatment device and heated to a high temperature, to form the housing. According to various example embodiments, a heating temperature of the mold may be greater than or equal to a melting point of the substrate 1110, and the insert portion 1120 and the elastic layer (not shown) may not be melted during heating.

According to various example embodiments, operation 1040 of forming the housing may include forming a shape of the housing by melting the substrate 1110. According to various example embodiments, the upper mold 1150A and the lower mold 1150B may be designed to form a desired shape of the housing, and the substrate 1110 in a preliminary form may be melted to form the desired shape of the housing (e.g., the front plate 320 and the rear plate 380 of FIG. 3) based on a shape of the upper mold 1150A and the lower mold 1150B.

According to various example embodiments, the elastic layer may be formed to prevent damage due to contraction and expansion of the substrate 1110 and the insert portion 1120. Accordingly, operation 1020 of forming the elastic layer may be performed to form the elastic layer to cover at least a portion of an area in which the substrate 1110 is melted in the mold and comes into contact with the insert portion 1120. According to various example embodiments, the elastic layer may be formed to completely cover an area in which the substrate 1110 is melted and comes into contact with the insert portion 1120.

Figure 12:
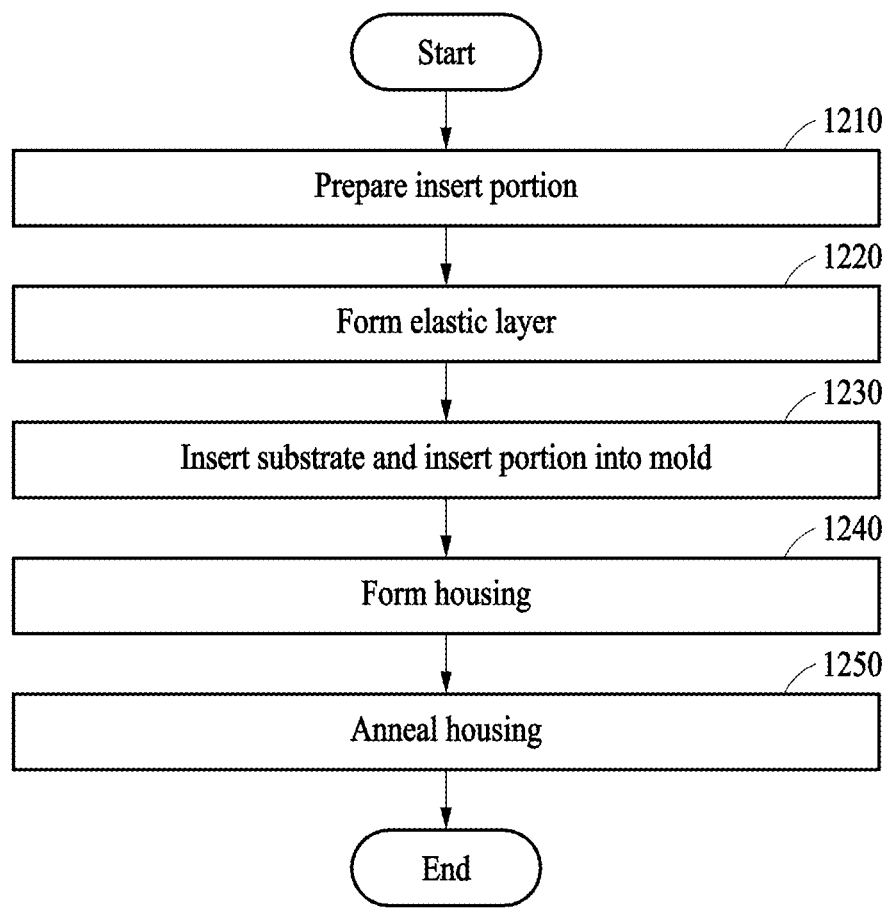
FIG. 12 is a flowchart illustrating a method of manufacturing an electronic device housing according to an example embodiment.

FIG. 12 is a flowchart illustrating a method of manufacturing an electronic device housing according to various example embodiments.

The method of FIG. 12 may include operation 1210 (e.g., operation 1010 of FIG. 10) of preparing an insert portion including at least one of a metal and a ceramic, operation 1220 (e.g., operation 1020 of FIG. 10) of forming an elastic layer on at least one area of a surface of the insert portion, operation 1230 (e.g., operation 1030 of FIG. 10) of inserting the insert portion and a substrate including glass, into a mold, and operation 1240 (e.g., operation 1040 of FIG. 10) of forming a housing by heating the mold.

According to various example embodiments, the method of FIG. 12 may further include operation 1250 of annealing the housing, after operation 1240 of forming the housing. Operation 1240 of forming the housing may be performed at a temperature of about 700° C. or greater, and operation 1250 of annealing the housing may be performed at a temperature of about 300° C. to about 650° C.

According to various example embodiments, operation 1240 of forming the housing and operation 1250 of annealing the housing may be individually performed in a mold pressing device. According to various example embodiments, an additional polishing operation and/or a strengthening operation may be performed on the formed housing.

According to various example embodiments, a method of manufacturing a housing of an electronic device may include an operation (e.g., operation 1010 of FIG. 10) of preparing an insert portion including at least one of a metal and a ceramic, an operation (e.g., operation 1020 of FIG. 10) of forming an elastic layer on at least one area of a surface of the insert portion, an operation (e.g., operation 1030 of FIG. 10) of inserting the insert portion and a substrate including glass into a mold, and an operation (e.g., operation 1040 of FIG. 10) of forming a housing by heating the mold.

According to various example embodiments, the mold may include an upper mold (e.g., the upper mold 1150A of FIG. 11) and a lower mold (e.g., the lower mold 1150B of FIG. 11) corresponding to the upper mold. The operation (e.g., operation 1040 of FIG. 10) of forming the housing may be performed by heating and pressing the mold.

According to various example embodiments, in the operation (e.g., operation 1040 of FIG. 10) of forming the housing, the substrate (e.g., the substrate 1110 of FIG. 11) may be melted to form a shape of the housing. In the operation (e.g., operation 1020 of FIG. 10) of forming the elastic layer, the elastic layer may be formed to cover at least a portion of an area in which the substrate is melted in the mold and comes into contact with the insert portion (e.g., the insert portion 1120 of FIG. 11).

According to various example embodiments, the method may further include, after the operation (e.g., operation 1240 of FIG. 12) of forming the housing, an operation (e.g., operation 1250 of FIG. 12) of annealing the housing. The operation of forming the housing may be performed at a temperature of about 700° C. or greater, and the operation of annealing the housing may be performed at a temperature of about 300° C. to about 650° C.

The electronic device according to various example embodiments may be one of various types of electronic devices. The electronic device may include, for example, a portable communication device (e.g., a smartphone), a computer device, a portable multimedia device, a portable medical device, a camera, a wearable device, or a home appliance device. According to an example embodiment of the disclosure, the electronic device is not limited to those described above.

It should be appreciated that various example embodiments of the present disclosure and the terms used therein are not intended to limit the technological features set forth herein to particular example embodiments and include various changes, equivalents, or replacements for a corresponding example embodiment. In connection with the description of the drawings, like reference numerals may be used for similar or related components.

It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Terms such as "first", "second", or "first" or "second" may simply be used to distinguish the component from other components in question, and may refer to components in other aspects (e.g., importance or order) is not limited.

It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element. It will be understood that when an element is referred to as being related to another element such as being "on" another element, it can be directly on the other element or intervening elements may be present therebetween. In contrast, when an element is referred to as being related to another element such as being "directly on" another element, there are no intervening elements present. For example, elements which are "directly on" each other, may form an interface with each other, may contact each other, etc.

As used in connection with various example embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC).

According to various example embodiments, each component (e.g., a module or a program) of the above-described components may include a single entity or multiple entities, and some of the multiple entities may be separately disposed in different components. According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

What is claimed is:

1. An electronic device housing comprising:
   a substrate comprising glass;
   an insert portion which is bonded to the substrate at a surface of the insert portion, and at which a functional component of an electronic device having the electronic device housing is disposed;
   the insert portion comprising a surface facing the substrate and at which the insert portion is bonded to the substrate; and
   an elastic layer which is between the substrate and the surface of the insert portion and extends along the surface of the insert portion, wherein a difference between a coefficient of expansion of the substrate and a coefficient of expansion of the insert portion is greater than or equal to about $10 \times 10^{-6}$ m/(m° C.).

2. The electronic device housing of claim 1, wherein the glass has a softening temperature of about 750 degrees Celsius or less.

3. The electronic device housing of claim 1, wherein the substrate comprises about 5 weight percent to about 35 weight percent of $Al_2O_3$, $Li_2O$, $Na_2O$ or $B_2O_3$.

4. The electronic device housing of claim 1, wherein the insert portion which is coupled to the substrate, comprises a metal or a ceramic.

5. The electronic device housing of claim 1, wherein a coefficient of expansion of the substrate is about 0.4 times to about 0.8 times a coefficient of expansion of the insert portion which is coupled to the substrate.

6. The electronic device housing of claim 1, wherein the substrate and the insert portion are spaced apart from each other by the elastic layer.

7. The electronic device housing of claim 1, further comprising:
   an adhesive layer between the substrate and the elastic layer,
   wherein the adhesive layer has a glass transition temperature of about 370 degrees Celsius to about 700 degrees Celsius.

8. The electronic device housing of claim 1, wherein the surface of the insert portion at which the insert portion is coupled to the substrate has an uneven portion, and the elastic layer has an uneven portion corresponding to the uneven portion of the insert portion.

9. The electronic device housing of claim 1, wherein the surface of the insert portion at which the insert portion is coupled to the substrate is a curved surface, and the elastic layer has a curved surface corresponding to the curved surface of the insert portion.

10. The electronic device housing of claim 1, wherein the elastic layer comprises silicon or ceramic fiber.

11. The electronic device housing of claim 1, wherein the elastic layer comprises a heat-resistant layer, and the heat-resistant layer comprises TaC or SiC.

12. The electronic device housing of claim 1, wherein the elastic layer has a melting point of about 1500 degrees Celsius or greater and an elastic modulus of about 200 gigapascals or greater.

13. The electronic device housing of claim 1, wherein
the substrate defines an opening extended through a thickness of the substrate, and
the insert portion is in the opening, to penetrate the thickness of the substrate.

14. The electronic device housing of claim 1, wherein the surface of the insert portion along which the elastic layer extends, has an average surface roughness (Ra) of about 0.1 micrometer to about 20 micrometers.

\* \* \* \* \*